United States Patent
Lee et al.

(10) Patent No.: US 11,291,144 B2
(45) Date of Patent: Mar. 29, 2022

(54) SHIELDING FILM INCLUDING PLURALITY OF LAYERS AND ELECTRONIC DEVICE USING THE SAME

(71) Applicant: Samsung Electronics Co., Ltd., Gyeonggi-do (KR)

(72) Inventors: Myeonggil Lee, Gyeonggi-do (KR); Hyein Park, Gyeonggi-do (KR); Jaedeok Lim, Gyeonggi-do (KR); Jihye Moon, Gyeonggi-do (KR); Cheehwan Yang, Gyeonggi-do (KR); Jangsun Yoo, Gyeonggi-do (KR); Kwangyong Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/669,592

(22) Filed: Oct. 31, 2019

(65) Prior Publication Data

US 2020/0137931 A1   Apr. 30, 2020

(30) Foreign Application Priority Data

Oct. 31, 2018 (KR) .......................... 10-2018-0132605

(51) Int. Cl.
*H05K 9/00* (2006.01)
*H05K 7/20* (2006.01)

(52) U.S. Cl.
CPC ....... *H05K 9/0022* (2013.01); *H05K 7/20454* (2013.01); *H05K 7/20509* (2013.01); *H05K 9/009* (2013.01); *H05K 9/0088* (2013.01)

(58) Field of Classification Search
CPC .. H01L 23/552; H05K 9/0024; H05K 9/0088; H05K 9/009; H05K 7/20254; H05K 7/20509
See application file for complete search history.

(56) References Cited

U.S. PATENT DOCUMENTS

| 6,596,937 | B2 | 7/2003 | Mazurkiewicz |
| 6,600,101 | B2 | 7/2003 | Mazurkiewicz |

(Continued)

FOREIGN PATENT DOCUMENTS

| JP | 2005-064266 A | 3/2005 |
| JP | 2011-018873 A | 1/2011 |

(Continued)

OTHER PUBLICATIONS

International Search Report dated Feb. 25, 2020.
European Search Report dated Sep. 16, 2021.

*Primary Examiner* — James Wu
(74) *Attorney, Agent, or Firm* — Cha & Reiter, LLC

(57) ABSTRACT

An electronic device and a shielding film are disclosed herein. The electronic device includes a printed circuit board and at least one electrical component mounted on the printed circuit board. The shielding film is disposed on at least a part of the printed circuit board to block electromagnetic waves generated by the printed circuit board and/or the electronic component. The shielding film includes a plurality of layers, and is attached to at least part of the printed circuit board and contacting an upper side surface of the electronic component, wherein at least part of the shielding film includes a nano-conductive fiber and is electrically connected with a ground part of the printed circuit board through the nano-conductive fiber.

13 Claims, 10 Drawing Sheets

(56) References Cited

U.S. PATENT DOCUMENTS

| | | |
|---|---|---|
| 6,849,800 B2 | 2/2005 | Mazurkiewicz |
| 6,900,383 B2 | 5/2005 | Babb et al. |
| 7,196,275 B2 | 3/2007 | Babb et al. |
| 7,214,889 B2 | 5/2007 | Mazurkiewicz |
| 7,245,896 B2 * | 7/2007 | Seo ............... H01Q 1/526 455/300 |
| 8,156,644 B2 | 4/2012 | Babb et al. |
| 8,563,875 B2 | 10/2013 | Dai et al. |
| 2001/0033478 A1 * | 10/2001 | Ortiz ............ H01R 13/6599 361/818 |
| 2002/0129951 A1 | 9/2002 | Babb et al. |
| 2004/0224559 A1 | 11/2004 | Nelson et al. |
| 2005/0162841 A1 * | 7/2005 | Ogatsu ............ H05K 3/284 361/816 |
| 2010/0294559 A1 | 11/2010 | Izawa et al. |
| 2010/0319981 A1 * | 12/2010 | Kapusta ........... H05K 9/0043 174/350 |
| 2011/0304991 A1 * | 12/2011 | Huang ............ H01L 23/3128 361/719 |
| 2012/0261181 A1 | 10/2012 | Izawa et al. |
| 2013/0082367 A1 | 4/2013 | Yoo |
| 2014/0008013 A1 | 1/2014 | Dai et al. |
| 2015/0009637 A1 * | 1/2015 | Kawaguchi ......... H05K 9/0088 361/751 |
| 2015/0282394 A1 | 10/2015 | Yumi |
| 2017/0012003 A1 | 1/2017 | Yoo |
| 2017/0181268 A1 * | 6/2017 | Chiu ................ H05K 3/284 |
| 2017/0318713 A1 | 11/2017 | Bang et al. |
| 2018/0131087 A1 | 5/2018 | Kim et al. |
| 2018/0235078 A1 | 8/2018 | Simonato et al. |
| 2019/0143636 A1 * | 5/2019 | Seo ................. C09J 7/38 361/760 |
| 2019/0320562 A1 | 10/2019 | Seo et al. |
| 2021/0029855 A1 | 1/2021 | Yoon et al. |

FOREIGN PATENT DOCUMENTS

| | | |
|---|---|---|
| KR | 10-0618085 B1 | 8/2006 |
| KR | 10-1250677 B1 | 4/2013 |
| KR | 10-2015-0079223 A | 7/2015 |
| KR | 10-2017-0136064 A | 12/2017 |
| KR | 10-2018-0068312 A | 6/2018 |
| WO | 2017/188615 A1 | 11/2017 |
| WO | 2017/209427 A1 | 12/2017 |
| WO | 2021/015424 A1 | 1/2021 |

\* cited by examiner

SHIELDING FILM INCLUDING PLURALITY OF LAYERS AND ELECTRONIC DEVICE USING THE SAME

CROSS-REFERENCE TO RELATED APPLICATION(S)

This application is based on and claims priority under 35 U.S.C. § 119 to Korean Patent Application No. 10-2018-0132605, filed on Oct. 31, 2018, in the Korean Intellectual Property Office, the disclosure of which is incorporated by reference herein its entirety.

BACKGROUND

1. Technical Field

The disclosure relates to a shielding technology in an electronic device, and, more particularly, to a shielding film that is disposed on a printed circuit board.

2. Description of Related Art

In recent years, executable functions of electronic devices (e.g., an electronic device such as a notebook PC, a tablet PC, a smartphone, or the like) have grown in sophistication and quality. Accordingly, the clock frequencies and data transfer rates of processing components of these devices have continued to increase to keep pace. However, the increased performance of these components results in greater electromagnetic noise. Accordingly, an issue exists of increased malfunction and degradation in the reception performance of wireless connectivity, because of electromagnetic interference (EMI) and noise interference (e.g., radio frequency interference (RFI)) generated within the electronic device.

The above information is presented as background information only to assist with an understanding of the disclosure. No determination has been made, and no assertion is made, as to whether any of the above might be applicable as prior art with regard to the disclosure.

SUMMARY

To resolve the issues of electromagnetic interference and the noise interference, electronic devices may utilize a shield "can" that is formed of a metal material.

When the shield can provides shielding for a wide area, degradation in shielding performance may result due to a loss of contact with a printed circuit board (e.g., separation of a contact portion). Furthermore, including the shield could result in increased weight for the wide area, because the shield could require a sidewall structure corresponding to the height of an electronic part, and require a certain thickness for retaining the shape.

Aspects of the disclosure are to address at least the above-mentioned problems and/or disadvantages and to provide at least the advantages described below. Accordingly, an aspect of the disclosure is to provide a shielding film that is light in weight (e.g., lighter than a shield can) that continues to provide a wide shielding area.

Another aspect of the disclosure is to provide a shielding film that can be maintained in close contact with a printed circuit board and an electronic part, thereby providing shielding for a wide area irrespective of dimensions of the electronic part (e.g., height, shape, etc.).

In accordance with an aspect of the disclosure, an electronic device includes a printed circuit board, at least one electronic component mounted on the printed circuit board, and a shielding film including a plurality of layers, the shielding film attached to at least part of the printed circuit board and contacting an upper side surface of the electronic component, wherein at least part of the shielding film includes a nano-conductive fiber and is electrically connected with a ground part of the printed circuit board through the nano-conductive fiber.

In accordance with another aspect of the disclosure, a shielding film attached to a printed circuit board having at least one electronic part mounted thereon includes: a shaping layer that is deformed to at least part of a shape of the electronic component by an application of a pressure, and maintains the deformed shape after release of the pressure, a conductive layer blocking electromagnetic waves generated from the printed circuit board and/or the electronic component, wherein the conductive layer is electrically connected with a ground part of the printed circuit board through a nano-conductive fiber plated with metal.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, certain embodiments of the disclosure may be described with reference to accompanying drawings. Accordingly, those of ordinary skill in the art will recognize that modification, equivalent, and/or alternative on the certain embodiments described herein can be variously made without departing from the disclosure.

Figure 1:
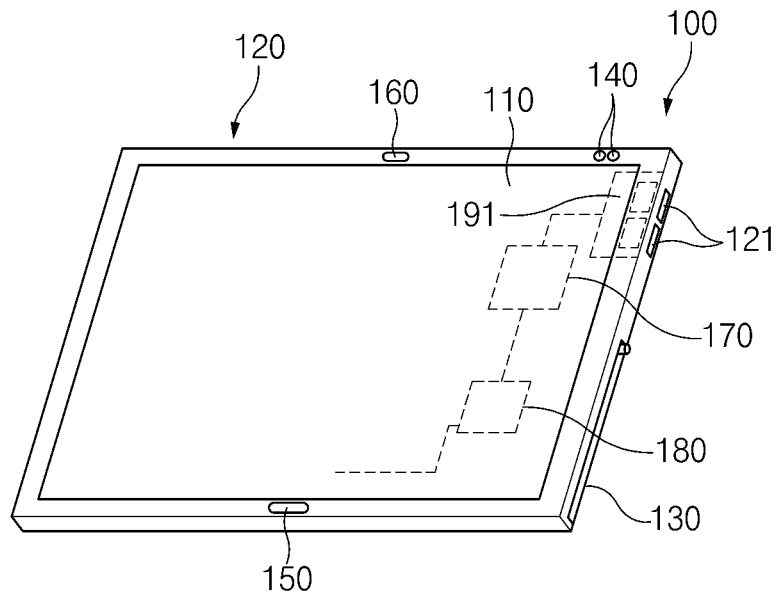
FIG. 1 is a view illustrating an example of the exterior of an electronic device according to certain embodiments.
Figure 1:
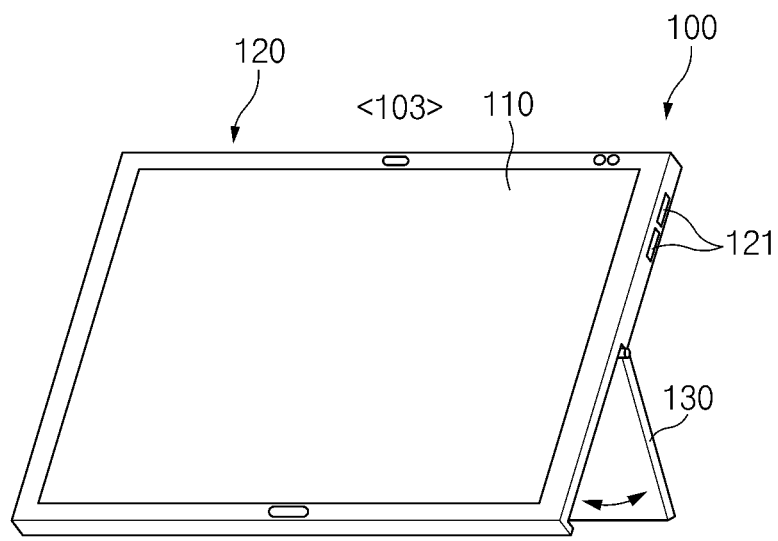

FIG. 1 is a view illustrating an example of the exterior of an electronic device according to certain embodiments.

In FIG. 1, state 101 illustrates a state in which a stand 130 of an electronic device 100 is folded, and state 103 illustrates a state in which the electronic device 100 is standing, as supported by the stand 130, unfolded at an angle relative to a main body of the device.

Referring to state 101 and state 103, the electronic device 100 according to an embodiment of the disclosure may include a display 110, a housing 120, the stand 130, a sensor module 140, a physical button 150, a speaker 160, a processor 170, communication circuitry 180, and an external interface module 191. The electronic device 100 may have, for example, a rectangular shape with a predetermined area and a relatively small thickness and may be implemented to be easy to carry. Here, it is understood that a technology to which a protective structure of the disclosure is applied is not limited to the kind or type of the electronic device 100, and the disclosure may be applied to any form of electronic device having a structure including an external interface module.

According to an embodiment, the display 110 may output a screen related to execution of a specified function, using power transmitted from a battery (not illustrated) in the electronic device 100, or received an external power supply. The display 110 may be implemented with various displays, such as a liquid crystal display or an organic light emitting diode (OLED) display. According to an embodiment, the display 110 may be implemented with a touch screen, which is capable of receiving touch inputs (e.g., a finger touch or a stylus touch) transferable to the processor 170, to facilitate control of the electronic device 100 by touch input. The display 110 may output various content items received from an external device connected via the external interface module 191 or a screen being output on an external communication device. Alternatively, when charging power is supplied through the external interface module 191, the display 110 may output a screen interface (e.g., an element or indicative icon) corresponding to the charging state.

According to an embodiment, the housing 120 may form at least part of the exterior of the electronic device 100. The entirety of the housing 120 may be formed of metal, or at least partly by a plastic material. Alternatively, part of the housing 120 may be formed of a metal material. For example, according to the need, the housing 120 may be formed of a metal material, and may include an injection-molded structure disposed therein. According to an embodiment, the display 110 may be seated on a particular surface (e.g., a front surface) of the housing 120. An adhesive member, or a coupling member such as a hook and/or a screw, may be utilized to affix (e.g., fasten or otherwise secure) the display 110 to the housing 120. The housing 120 may include a hollow "box" shape defining an interior hollow, in which the display 110 may be disposed. In this case, the housing 120 may include a plurality of sidewalls, each of which at least partially contacts the edge of the display 110. The housing 120 may include a lower housing for receiving at least one of the display 110 and a component and/or part (e.g., a printed circuit board on which at least one of the processor 170 and the communication circuitry 180 is placed) and an upper housing, and/or a bezel housing that surrounds the exterior of the display 110.

According to an embodiment, one of the sidewalls may include an interface hole 121 through which at least part of the external interface module 191 is exposed to an exterior of the device. Although two interface holes 121 are illustrated in the drawing, the disclosure is not limited to this example. For example, when the external interface module 191 includes one socket (or connector) that is connected with an external device (e.g., a communication device or a charging device), one interface hole 121 may be formed in the sidewall. Alternatively, when the external interface module 191 includes three sockets, three interface holes 121 may be formed in the sidewall, etc. Any desired number of interface holes may be utilized.

According to an embodiment, the interface hole 121 may be formed in any desirable shape, including an oval shape, or a rectangular shape with rounded corners, which is relatively long in the lengthwise direction of the sidewall. The shape or size of the interface hole 121 may be determined depending on the shape of a connectable cable for the interface, or the shape of an external device. The interface hole 121 may be provided in the form of a through-passage that penetrates through the sidewall of the housing 120 in a direction parallel to the surface on which the display 110 is placed, as seen in FIG. 1, and connects the inside of the housing 120 to an exterior of the device. An outer side of the interface hole 121 (e.g., one side of the interface hole 121 that is directed toward the outside of the housing 120) and an inner side of the interface hole 121 (e.g., an opposite side of the interface hole 121 that is directed toward the inside of the housing 120) may have the same shape and size. Alternatively, in one example device, the outer side and the inner side of the interface hole 121 may have different sizes. A portion of the protective structure may be disposed on or around at least part of the inner wall of the interface hole 121 (e.g., the wall surface of the passage formed in the housing 120).

According to an embodiment, the stand 130 may be provided on one side of a rear surface of the electronic device 100 (e.g., a back surface, or the opposite side to the display 110 when the surface on which the display 110 is disposed is referred to as a front surface) to support standing of the electronic device 100 at a predetermined angle. The stand 130 may be provided, for example, by mechanically configuring at least part of the housing 120. The stand 130 may include a hinge such that a support "leg" connected with the housing 120 is rotatable relative to the housing 120, such that when the support is unfolded, it supports an upright stand of the electronic device 100. When the stand 130 is folded and stowed as to be brought into flat contact with the housing 120, the stand 130 may be seated in the housing 120, and the rear surface of the electronic device 100 may be generally flat. In this regard, a seating area on which the stand 130 is seated may be provided in at least a partial area of one side of a rear surface of the housing 120.

According to an embodiment, the sensor module 140 may include at least one sensor for detecting various pieces of information related to operation of the electronic device 100. For example, the sensor module 140 may include a camera or an image sensor for capturing an image of a subject. The sensor module 140 may include at least one of an iris sensor for recognition of the user's iris, a proximity sensor for sensing approach of an object, and/or an illuminance sensor for sensing environmental illuminance. According to certain embodiments, the sensor module 140 may further include at least one of a position detection sensor for detecting a position, an acceleration sensor, and/or a terrestrial magnetism sensor.

According to an embodiment, at least part of the physical button 150 may be disposed on one side of the housing 120 of the electronic device 100. For example, the physical button 150 may include at least one of a home button or a power button. Furthermore, the electronic device 100 may further include physical buttons for adjusting volume. A portion of the physical button 150 may be disposed within the device as to emerge through a button hole provided on one side of the housing 120, such that a portion of the button 150 is exposed to an exterior of the device facilitating actuation by a user. For example, an upper end surface of the physical button 150 may be disposed at the same height as, or in a lower position than, the surface around the button hole of the housing 120.

According to an embodiment, the speaker 160 may output an audio signal according to execution of a function of the electronic device 100. For example, the speaker 160 may operate as a receiver that outputs an audio signal according to execution of a telephone call function of the electronic device 100. At least part of the speaker 160 may be disposed on one side of the housing 120. Additionally, the electronic device 100 may further include a microphone for collecting the user's voice. In addition, the electronic device 100 may further include an ear jack for connection of an earphone.

According to an embodiment, the processor 170 may be disposed within the housing 120. The processor 170 may be disposed so as to avoid any exposure to the exterior, by being completely covered with the display 110. The processor 170 may be operatively connected with at least one of various components of the electronic device 100, for example, the sensor module 140, the physical button 150, the speaker 160, and the external interface module 191. According to certain embodiments, when an external device is connected via the external interface module 191, the processor 170 may identify the type of the external device and may perform processing for operation of the external device. For example, the processor 170 may establish a communication channel with the external device and may process data transmission/reception with the external device, or when the external device is a charging device, the processor 170 may receive power from the external device.

According to an embodiment, the communication circuitry 180 may be disposed inside the housing 120 similarly to the processor 170 and may be protected from any exposure to an exterior of the device, by being covered with the display 110. The communication circuitry 180 may be operatively connected with the processor 170 and may support a communication function of the electronic device 100 according to control of the processor 170. For example, the communication circuitry 180 may establish a base station based communication channel, or may establish a short-range communication channel with at least one of Wi-Fi or Bluetooth. The communication circuitry 180 may be electrically connected with at least part of the housing 120 and may radiate or receive a signal via the at least part of the housing 120. In this regard, the at least part of the housing 120 may be formed of a metal material.

According to an embodiment, at least one electronic part (e.g., a circuit component utilized for operations of the processor 170, the communication circuitry 180, and the electronic device 100) may be mounted on a printed circuit board and may be disposed inside the housing 120. A portion of the printed circuit board may be shielded by at least one shielding film. For example, one shielding film may shield the entire printed circuit board. Alternatively, a plurality of shielding films having different sizes and shapes may each shield a portion of the printed circuit board. The shielding film may include a plurality of layers. The shielding film may be brought into close contact with an upper side surface of the electronic part. The shielding film may block electromagnetic waves generated from the electronic part. Configurations and features of shielding films according to embodiments of the disclosure will be described below in detail with reference to FIGS. 2, 3, and 4A to 4F.

According to an embodiment, the external interface module 191 may be disposed on one side of the edge of the inside of the housing 120. For example, the external interface module 191 may be disposed inward of the edge of the area where the interface hole 121 is formed in the housing 120. The external interface module 191 may include at least one of, for example, a printed circuit board, a socket, and an electronic part connected to the socket. At least part of the socket of the external interface module 191 may be disposed so as to be observed from the outside through the interface hole 121. The external interface module 191 may include at least one electrode or port in relation to connection with an external device. For example, the external interface module 191 may support connection with various external devices, such as USB connection, UART connection, charger connection, and earphone connection. The external interface module 191 may include a plurality of sockets to support connection with a plurality of external devices.

Figure 2:
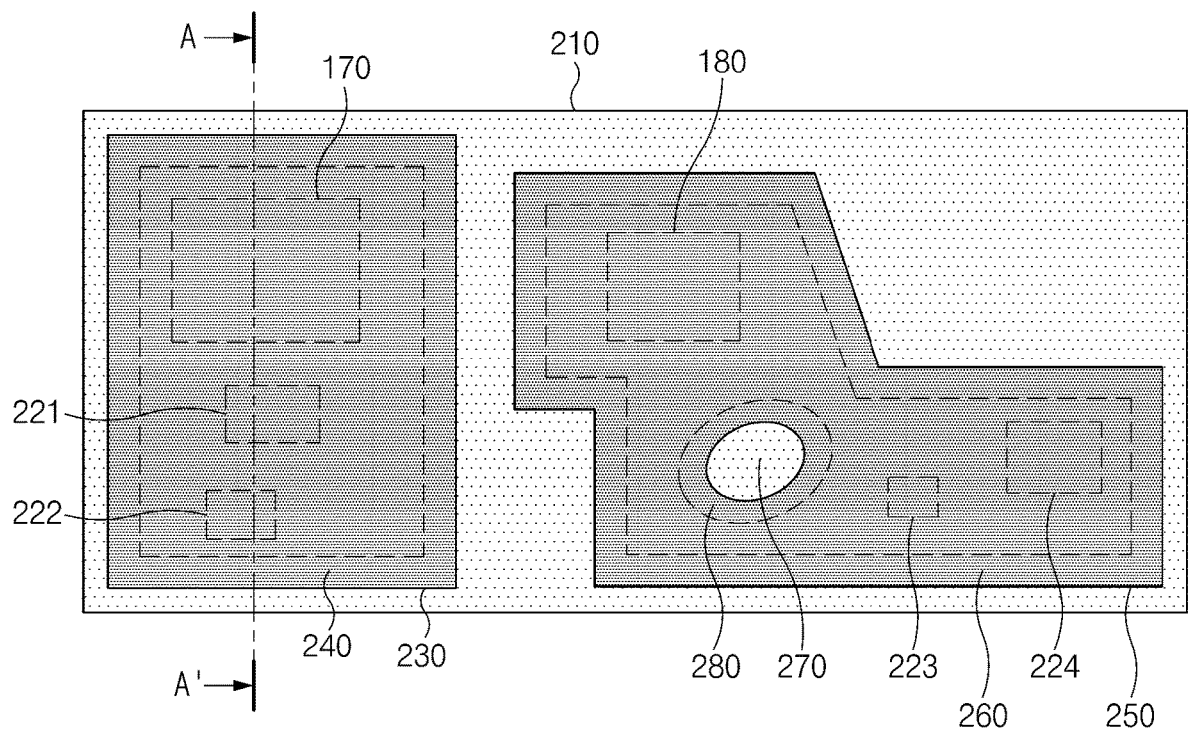
FIG. 2 is a plan view illustrating an example state in which a shielding film according to an embodiment is attached to a printed circuit board.
Figure 3:
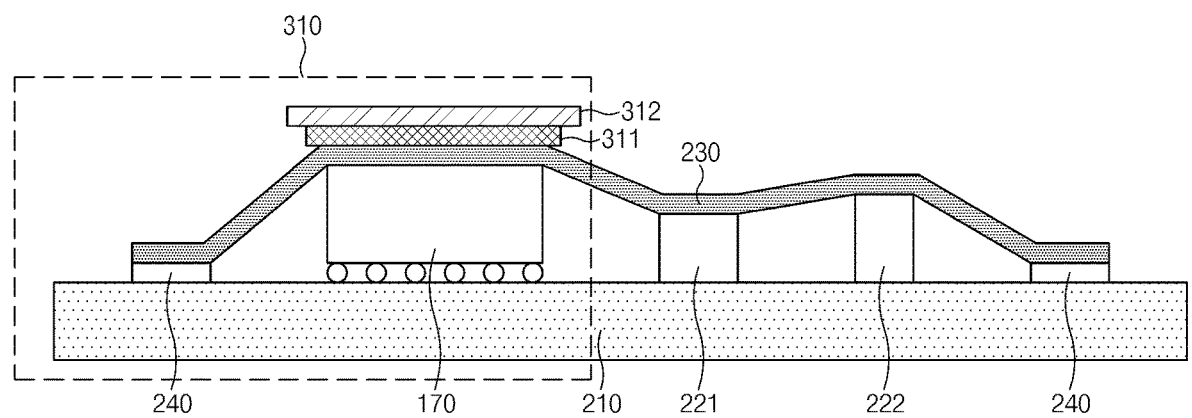
FIG. 3 is a sectional view illustrating the example state in which the shielding film according to the embodiment is attached to the printed circuit board.

FIG. 2 is a plan view illustrating a state in which a shielding film (230, 250) according to an embodiment of the disclosure is attached to a printed circuit board. FIG. 3 is a sectional view illustrating the state in which the shielding film according to the embodiment of the disclosure is attached to the printed circuit board.

Referring to FIGS. 1 to 3, the electronic device 100 may include, inside the housing 120, a printed circuit board 210 having the processor 170, the communication circuitry 180, and one or more electronic parts 221 to 224 mounted thereon. One or more shielding films 230 and 250 may be attached to at least part of the printed circuit board 210. The one or more shielding films 230 and 250 may be attached as to be disposed on the processor 170, the communication circuitry 180, and some of the one or more electronic part 221 to 224, to block electromagnetic waves generated from the processor 170, the communication circuitry 180, and the one or more electronic parts 221 to 224. The one or more shielding films 230 and 250 may be at least partially attached to the printed circuit board 210 through a hot pressing process.

According to an embodiment, the shielding film 230 may be disposed (or attached) on the processor 170 and the electronic parts 221 and 222. The shielding film 230 may be attached to be electrically connected with a ground part 240 that surrounds the area around the processor 170 and the electronic parts 221 and 222. The shielding film 230 may be attached to cover a specific area of the printed circuit board 210.

According to an embodiment, the shielding film 250 may be disposed (or attached) on the communication circuitry 180 and the electronic parts 223 and 224. The shielding film 250 may be electrically connected with a ground part 260 that surrounds the area around the processor 170 and the electronic parts 223 and 224. The shielding film 250 may be cut in various shapes and attached to the printed circuit board 210. The shielding film 250 may define an empty area 270 formed therein. A ground part 280 may be disposed around the empty area 270, and the shielding film 250 may be attached to be electrically connected with the ground part 280.

According to an embodiment, the shielding films 230 and 250 may each include a plurality of layers. The shielding films 230 and 250 may each include a conductive layer that blocks electromagnetic waves. The conductive layers of the shielding films 230 and 250 may be electrically connected with the ground parts 240, 260, and 280 through nano-conductive fiber layers. The nano-conductive fiber layers may include an adhesive and may be attached to the ground parts 240, 260, and 280 through a hot pressing process. According to certain embodiments, the conductive layers may include a nano-conductive fiber layer.

According to an embodiment, each of the nano-conductive fiber layers may be formed by plating one of a carbon fiber, a silver nanowire, or a polymer fiber with metal, and may include hot-melting powder. For example, the nano-conductive fiber layer may include a polymer fiber (e.g., polyester yarn) having plating layers formed thereon utilizing nickel (Ni) and copper (Cu), and hot-melting powder. For a plating process, the nano-conductive fiber layer may include a polymer fiber (e.g., polyester yarn) that has high hydrophilicity. According to certain embodiments, the polymer fiber of the nano-conductive fiber layer may have plating layers formed thereon in the order of nickel (Ni), copper (Cu), and nickel (Ni). The nickel (Ni) layer (which may be firstly plated) may improve adhesion of the copper (Cu) layer to the polymer fiber. The nickel (Ni) layer (when plated last) may prevent corrosion of the copper (Cu) layer.

According to an embodiment, the copper (Cu) layer of the nano-conductive fiber layer may be thicker than the nickel (Ni) layers, to improve electrical conductivity. The thicknesses of the nickel (Ni) layers and the copper (Cu) layer may be set depending on the concentrations using for the plating solutions, and time.

According to an embodiment, the shielding films 230 and 250 may each include a three-dimensional shaping layer (e.g., an aluminum thin film) that is deformed in three dimensions by pressure and that remains deformed after removal of the pressure. The three-dimensional shaping layers may allow the shielding films 230 and 250 to deform depending on the exterior shapes of the processor 170, the communication circuitry 180, and the electronic parts 221 to 224 and maintain the deformed shapes. The shielding films 230 and 250 may be brought into close contact with upper portions of the processor 170, the communication circuitry 180, and the electronic parts 221 to 224.

According to an embodiment, the shielding films 230 and 250 may each include a first insulation layer between the conductive layer and the printed circuit board 210. The first insulation layer may prevent a short circuit between the conductive layer, and the printed circuit board 210 and circuit parts (e.g., the processor 170, the communication circuitry 180, and the electronic parts 221 to 224) mounted on the printed circuit board 210.

According to an embodiment, in the shielding films 230 and 250, one metal layer may serve as a conductive layer and a three-dimensional shaping layer. According to certain embodiments, in the shielding films 230 and 250, the conductive layer (e.g., a nano-conductive fiber layer) and the three-dimensional shaping layer (e.g., a metal layer) may be formed to be separated from each other.

According to an embodiment, the shielding films 230 and 250 may each include a second insulation layer in the top layer thereof. The second insulation layer may prevent damage to the three-dimensional shaping layer during a hot pressing process. According to certain embodiments, the second insulation layer may be optional, and the lamination of the second insulation layer may be omitted.

According to an embodiment, a heat dissipation member may be disposed on a portion of each of the shielding films 230 and 250. For example, a thermal interface material (TIM) 311 or a heat dissipation plate 312 may be disposed on the shielding films 230 and 250 to correspond to an electronic part (e.g., the processor 170) that radiates a relatively large amount of heat. For example, the heat dissipation plate 312 may be disposed alone on the shielding films 230 and 250. Alternatively, the TIM 311 may be disposed between the heat dissipation plate 312 and the shielding films 230 and 250.

According to an embodiment, the first insulation layer may be removed from a portion of each of the shielding films 230 and 250 (or, a hole may be formed in the portion), and thus, the heat dissipation performance of the shielding films 230 and 250 may be improved. For example, the first insulation layer may be partly removed from a portion of each of the shielding films 230 and 250 that corresponds to an electronic part (e.g., the processor 170) that radiates a relatively large amount of heat (and/or, a hole may be formed in the relevant portion of the film). An upper portion of the electronic part that radiates a relatively large amount of heat may have direct contact with the conductive layer, and a heat dissipation member (e.g., the TIM 311 or the heat dissipation plate 312) may be disposed on the shielding films 230 and 250, thereby improving heat dissipation performance.

FIGS. 4A to 4F are views illustrating configurations of shielding films according to embodiments of the disclosure. FIGS. 4A to 4F illustrate a dotted box 310 of FIG. 3 in detail indicated as elements 310*a*, 310*b*, 310*c*, 310*d*, 310*e*, 310*f*, respectively.

Figure 4A:
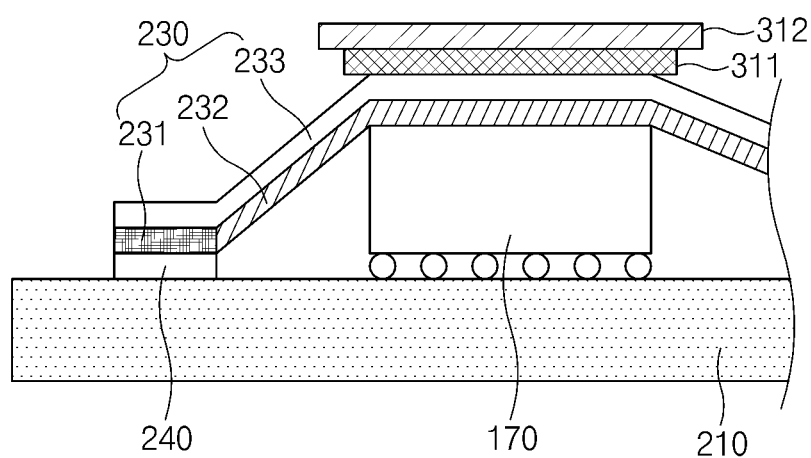
FIG. 4A is a view illustrating an example configuration of a shielding film according to an embodiment.

Referring to FIG. 4A, the shielding film 230 may include a nano-conductive fiber layer 231, an insulation layer 232, and a metal layer 233. For example, the metal layer 233 may be laminated on the insulation layer 232.

According to an embodiment, the metal layer 233 may serve as a conductive layer and a three-dimensional shaping layer. For example, the metal layer 233 may block electromagnetic waves radiated from the processor 170 (e.g., or any relevant electronic part or component). Furthermore, the metal layer 233 may deform according to the shape of the processor 170 (or the electronic part or component on which it is disposed) during the hot pressing process, and may remain deformed after the hot pressing process is completed. For example, the metal layer 233 may be implemented with an aluminum thin film.

According to an embodiment, the insulation layer 232 may prevent short circuits between the printed circuit board 210, the processor 170 (or the electronic part) and/or the metal layer 233. The insulation layer 232 may also deform according to the shape of the processor 170 (or the electronic part) during the hot pressing process. The deformation may be implemented based on a feature of the insulation layer 232, which may be formed of a material that stretches in reaction to heat.

According to an embodiment, the nano-conductive fiber layer 231 may electrically connect the metal layer 233 and the ground part 240. For example, the nano-conductive fiber layer 231 may include an adhesive member (e.g., hot-melting powder), and may be attached to the ground part 240 through the hot pressing process. The adhesive member (e.g., hot-melting powder) may be melted at a temperature selected as to avoid adversely affecting the durability of the printed circuit board 210 and the processor 170 (or the electronic part). The nano-conductive fiber layer 231 may include electrical conductivity owing to being plated with a metal material.

According to an embodiment, a heat dissipation member may be disposed on a portion of the shielding film 230. For example, the TIM 311 or the heat dissipation plate 312 may be disposed on the shielding film 230 to correspond positionally to electronic parts and components (e.g., the processor 170) that radiate a relatively large amount of heat. For example, the heat dissipation plate 312 may be disposed on the shielding film 230. Alternatively, the TIM 311 may be disposed between the shielding film 230 and the heat dissipation plate 312.

Figure 4B:
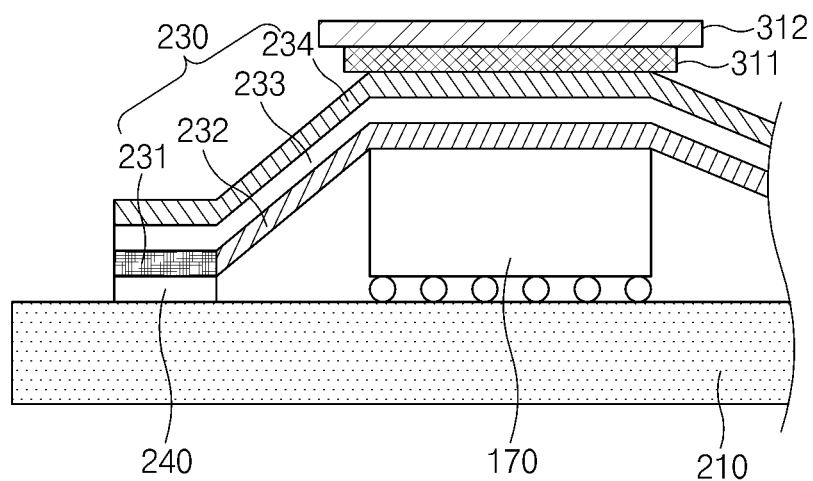
FIG. 4B is a view illustrating an example configuration of a shielding film according to another embodiment.

Referring to FIG. 4B, the shielding film 230 may include the nano-conductive fiber layer 231, the first insulation layer 232, the metal layer 233, and a second insulation layer 234. For example, the metal layer 233 may be laminated on the first insulation layer 232. The second insulation layer 234 may be laminated on the metal layer 233.

According to an embodiment, the metal layer 233 may serve as a conductive layer and a three-dimensional shaping layer. For example, the metal layer 233 may block electromagnetic waves radiated from the processor 170 (or an electronic part). Furthermore, the metal layer 233 may deform according to the shape of the processor 170 (or the electronic part on which it is disposed) during a hot pressing process, and may remain deformed after the hot pressing process is completely performed. For example, the metal layer 233 may be implemented with an aluminum thin film.

According to an embodiment, the first insulation layer 232 may prevent a short circuit between the printed circuit board 210 and/or the processor 170 (or the electronic part) and the metal layer 233. The second insulation layer 234 may prevent damage to the metal layer 233 during the hot pressing process. The first insulation layer 232 and the second insulation layer 234 may deform according to the shape of the processor 170 (or the electronic part on which it is disposed) during the hot pressing process, because the first insulation layer 232 and the second insulation layer 234 may be implemented using materials which stretch in reaction to heat.

According to an embodiment, the nano-conductive fiber layer 231 may electrically connect the metal layer 233 and the ground part 240. For example, the nano-conductive fiber layer 231 may include an adhesive member (e.g., hot-melting powder), and may be attached to the ground part 240 through the hot pressing process. The adhesive member (e.g., hot-melting powder) may be melted at a temperature selected as to avoid adversely affecting the durability of the printed circuit board 210 and the processor 170 (or any other relevant electronic part or component). The nano-conductive fiber layer 231 may have electrical conductivity owing to being plated with metal.

According to an embodiment, the first insulation layer 232 and the second insulation layer 234 may have the same thickness. According to certain embodiments, the first insulation layer 232 and the second insulation layer 234 may have different thicknesses. For example, the first insulation layer 232 may be formed to be thicker than the second insulation layer 234.

According to an embodiment, the first insulation layer 232 and the second insulation layer 234 may be formed of the same material. According to certain embodiments, the first insulation layer 232 and the second insulation layer 234 may be formed of different materials. For example, the first insulation layer 232 may be formed of a polymer with high insulation, and the second insulation layer 234 may be formed of a polymer with high durability.

According to an embodiment, a heat dissipation member may be disposed on a portion of the shielding film 230. For example, the TIM 311 or the heat dissipation plate 312 may be disposed on the shielding film 230 positionally corresponding to the electronic part (e.g., the processor 170) that radiates a relatively large amount of heat. For example, the heat dissipation plate 312 may be disposed alone on the shielding film 230. Alternatively, the TIM 311 may be disposed between the shielding film 230 and the heat dissipation plate 312.

Figure 4C:
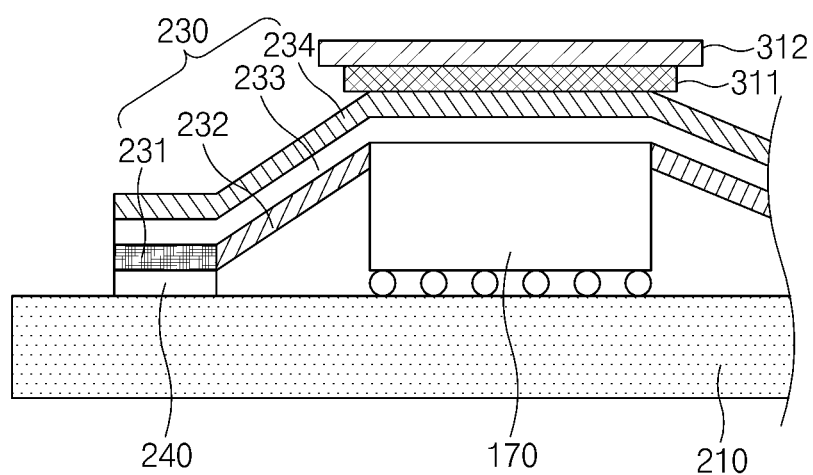
FIG. 4C is a view illustrating an example configuration of a shielding film according to another embodiment.

Referring to FIG. 4C, the shielding film 230 may include the nano-conductive fiber layer 231, the first insulation layer 232, the metal layer 233, and the second insulation layer 234. The nano-conductive fiber layer 231, the first insulation layer 232, the metal layer 233, and the second insulation layer 234 of FIG. 4C may have the same configurations and characteristics as, or configurations and characteristics similar to, those of the nano-conductive fiber layer 231, the first insulation layer 232, the metal layer 233, and the second insulation layer 234 of FIG. 4B. Therefore, descriptions of the same or similar configurations and characteristics will be omitted.

According to an embodiment, a portion of the first insulation layer 232 may be removed from the shielding film 230 (or, a hole may be formed in the portion of the first insulation layer 232). For example, a portion of the first insulation layer 232 that corresponds to the position of the processor 170 (or the electronic part) may be removed or omitted (or, a hole may be formed in the portion of the first insulation layer 232). Accordingly, an upper side surface of the processor 170 (or the electronic part) may directly contact the metal layer 233. The heat dissipation performance of the shielding film 230 may be improved by the direct contact between the upper side surface of the processor 170 (or the electronic part) and the metal layer 233.

According to certain embodiments, a heat dissipation member (e.g., the TIM 311 or the heat dissipation plate 312) may be disposed on one surface of the second insulation layer 234 that corresponds to the position of the processor 170 (or the electronic part), and thus the heat dissipation performance of the shielding film 230 may be further improved.

Figure 4D:
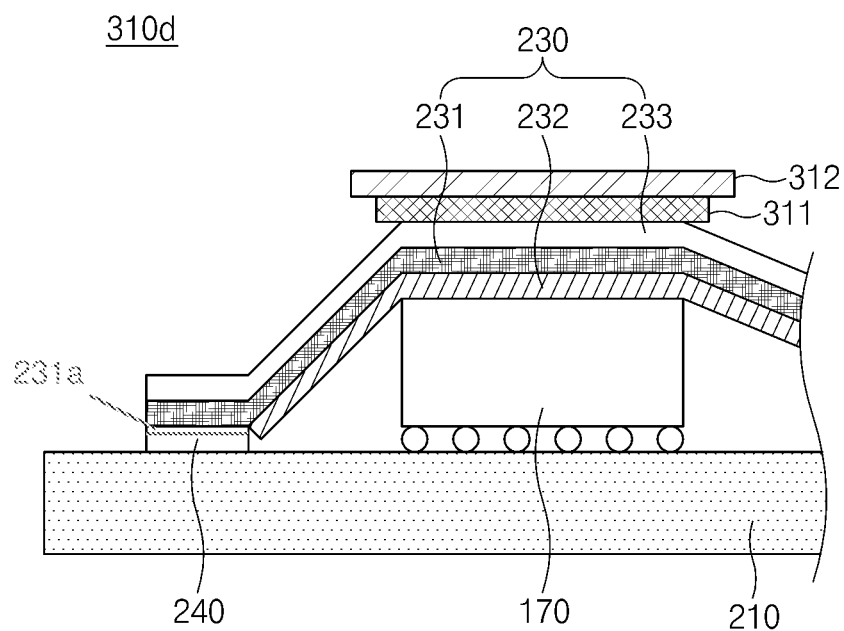
FIG. 4D is a view illustrating an example configuration of a shielding film according to another embodiment.

Referring to FIG. 4D, the shielding film 230 may include the nano-conductive fiber layer 231, the insulation layer 232, and the metal layer 233. For example, the nano-conductive fiber layer 231 may be laminated on the insulation layer 232. The metal layer 233 may be laminated on the nano-conductive fiber layer 231.

According to an embodiment, the nano-conductive fiber layer 231 may serve as a conductive layer. The metal layer 233 may serve as a three-dimensional shaping layer. The nano-conductive fiber layer 231 may block electromagnetic waves radiated from the processor 170 (or an electronic part). The metal layer 233 may deform according to the shape of the processor 170 (or the electronic part) during a hot pressing process, and may remain deformed after the hot pressing process is completely performed. For example, the metal layer 233 may be implemented with an aluminum thin film.

According to an embodiment, the insulation layer 232 may prevent a short circuit between the printed circuit board 210 or the processor 170 (or the electronic part) and the nano-conductive fiber layer 231. The insulation layer 232 may deform depending on the shape of the processor 170 (or the electronic part) during the hot pressing process because the insulation layer 232 has a feature of stretching in reaction to heat.

According to an embodiment, the nano-conductive fiber layer 231 may be electrically connected with the ground part 240. For example, the insulation layer 232 may be removed from a portion of the shielding film 230 that is brought into contact with the ground part 240. The nano-conductive fiber layer 231 may include an adhesive member 231a (e.g., hot-melting powder) and may be attached to the ground part 240 through the hot pressing process. The adhesive member (e.g., hot-melting powder) may be melted at a temperature not affecting the durability of the printed circuit board 210 and the processor 170 (or the electronic part). The nano-conductive fiber layer 231 may have electrical conductivity by being plated with metal. Accordingly, the nano-conductive fiber layer 231 may be electrically connected to the ground part 240 and may block electromagnetic waves generated from the printed circuit board 210 and the processor 170 (or the electronic part).

According to an embodiment, a heat dissipation member may be disposed on a portion of the shielding film 230. For example, the TIM 311 or the heat dissipation plate 312 may be disposed on the shielding film 230 to correspond to the electronic part (e.g., the processor 170) that radiates a relatively large amount of heat. For example, the heat dissipation plate 312 may be disposed alone on the shielding film 230. Alternatively, the TIM 311 may be disposed between the shielding film 230 and the heat dissipation plate 312.

Figure 4E:
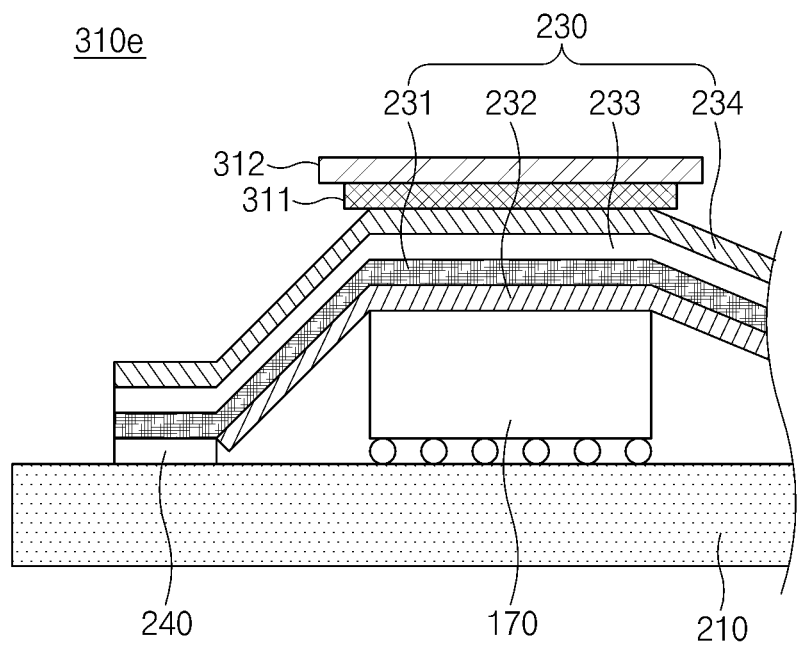
FIG. 4E is a view illustrating an example configuration of a shielding film according to another embodiment.

Referring to FIG. 4E, the shielding film 230 may include the nano-conductive fiber layer 231, the first insulation layer 232, the metal layer 233, and the second insulation layer 234. For example, the nano-conductive fiber layer 231 may be laminated on the first insulation layer 232. The metal layer 233 may be laminated on the nano-conductive fiber layer 231. The second insulation layer 234 may be laminated on the metal layer 233.

According to an embodiment, the nano-conductive fiber layer 231 may have a thickness of 15 μm to 19 μm, the first insulation layer 232 may have a thickness of 50 μm to 70 μm, the metal layer 233 may have a thickness of 10 μm to 14 μm, and the second insulation layer 234 may have a thickness of 10 μm to 15 μm.

According to an embodiment, the nano-conductive fiber layer 231 may serve as a conductive layer. The metal layer 233 may serve as a three-dimensional shaping layer. The nano-conductive fiber layer 231 may block electromagnetic waves radiated from the processor 170 (or an electronic part). The metal layer 233 may deform according the shape of the processor 170 (or the electronic part) during a hot pressing process, and may remain deformed after the hot pressing process is completely performed. For example, the metal layer 233 may be implemented with an aluminum thin film.

According to an embodiment, the first insulation layer 232 may prevent a short circuit between the printed circuit board 210 or the processor 170 (or the electronic part) and the nano-conductive fiber layer 231. The second insulation layer 234 may prevent damage to the metal layer 233 during the hot pressing process. The first insulation layer 232 and the second insulation layer 234 may deform depending on the shape of the processor 170 (or the electronic part) during the hot pressing process, because the first insulation layer 232 and the second insulation layer 234 may be formed of a material which includes a characteristic of stretching in reaction to the application heat.

According to an embodiment, the nano-conductive fiber layer 231 may be electrically connected with the ground part 240. For example, the first insulation layer 232 may be removed from a portion of the shielding film 230 that is brought into contact with the ground part 240. The nano-conductive fiber layer 231 may include an adhesive member (e.g., hot-melting powder) and may be attached to the ground part 240 through the hot pressing process. The adhesive member (e.g., hot-melting powder) may be melted at a temperature not affecting the durability of the printed circuit board 210 and the processor 170 (or the electronic part). The nano-conductive fiber layer 231 may have electrical conductivity by being plated with metal. Accordingly, the nano-conductive fiber layer 231 may be electrically connected to the ground part 240 and may block electromagnetic waves generated from the printed circuit board 210 and the processor 170 (or the electronic part).

According to an embodiment, the first insulation layer 232 and the second insulation layer 234 may have the same thickness. According to certain embodiments, the first insulation layer 232 and the second insulation layer 234 may have different thicknesses. For example, the first insulation layer 232 may be formed to be thicker than the second insulation layer 234.

According to an embodiment, the first insulation layer 232 and the second insulation layer 234 may be formed of the same material. According to certain embodiments, the first insulation layer 232 and the second insulation layer 234 may be formed of different materials. For example, the first insulation layer 232 may be formed of a polymer with high insulation, and the second insulation layer 234 may be formed of a polymer with high durability.

According to an embodiment, a heat dissipation member may be disposed on a portion of the shielding film 230. For example, the TIM 311 or the heat dissipation plate 312 may be disposed on the shielding film 230 to correspond to the electronic part (e.g., the processor 170) that radiates a relatively large amount of heat. For example, the heat dissipation plate 312 may be disposed alone on the shielding film 230. Alternatively, the TIM 311 may be disposed between the shielding film 230 and the heat dissipation plate 312.

Figure 4F:
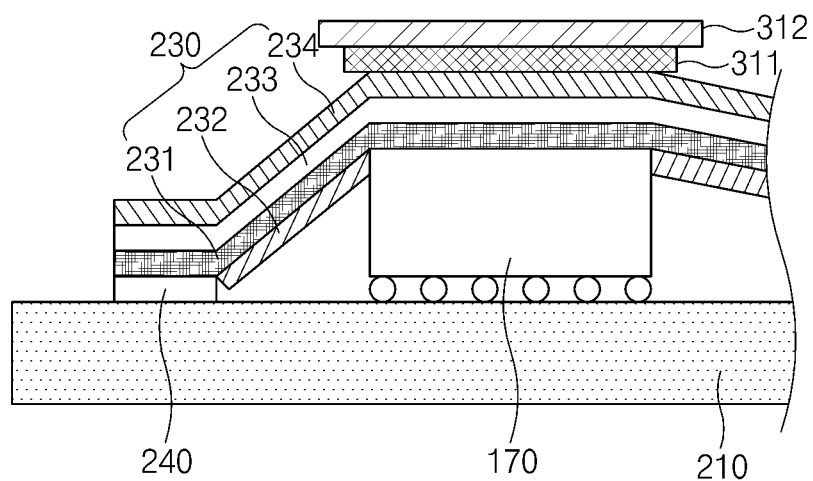
FIG. 4F is a view illustrating an example configuration of a shielding film according to another embodiment.

Referring to FIG. 4F, the shielding film 230 may include the nano-conductive fiber layer 231, the first insulation layer 232, the metal layer 233, and the second insulation layer 234. The nano-conductive fiber layer 231, the first insulation layer 232, the metal layer 233, and the second insulation layer 234 of FIG. 4F may have the same configurations and characteristics as, or configurations and characteristics similar to, those of the nano-conductive fiber layer 231, the first insulation layer 232, the metal layer 233, and the second insulation layer 234 of FIG. 4E. Therefore, descriptions of the same or similar configurations and characteristics will be omitted.

According to an embodiment, a portion of the first insulation layer 232 may be removed from the shielding film 230 (e.g., a hole may be formed in the portion of the first insulation layer 232). For example, a portion of the first insulation layer 232 that corresponds to the position of the processor 170 (or the relevant electronic part or component) may be removed (or, a hole may be formed in the portion of the first insulation layer 232). Accordingly, an upper side surface of the processor 170 (or the electronic part) may directly contact the metal layer 233. The heat dissipation performance of the shielding film 230 may be improved by the direct contact between the upper side surface of the processor 170 (or the electronic part) and the metal layer 233.

According to certain embodiments, a heat dissipation member (e.g., the TIM 311 or the heat dissipation plate 312) may be disposed on one surface of the second insulation layer 234 that corresponds to the position of the processor 170 (or the electronic part), and thus the heat dissipation performance of the shielding film 230 may be further improved.

In FIGS. 3 and 4A to 4F, the ground part 240 is illustrated as protruding from the surface of the printed circuit board 210. However, the disclosure is not limited thereto. For example, the upper end of the ground part 240 may be disposed at the same height as, or in a lower position than, the surface of the printed circuit board 210. In such cases, an insulation layer on the surface of the printed circuit board 210 may be removed, and a metal layer disposed under the surface and exposed by the removal of the insulation layer may serve as the ground part 240.

Figure 5:
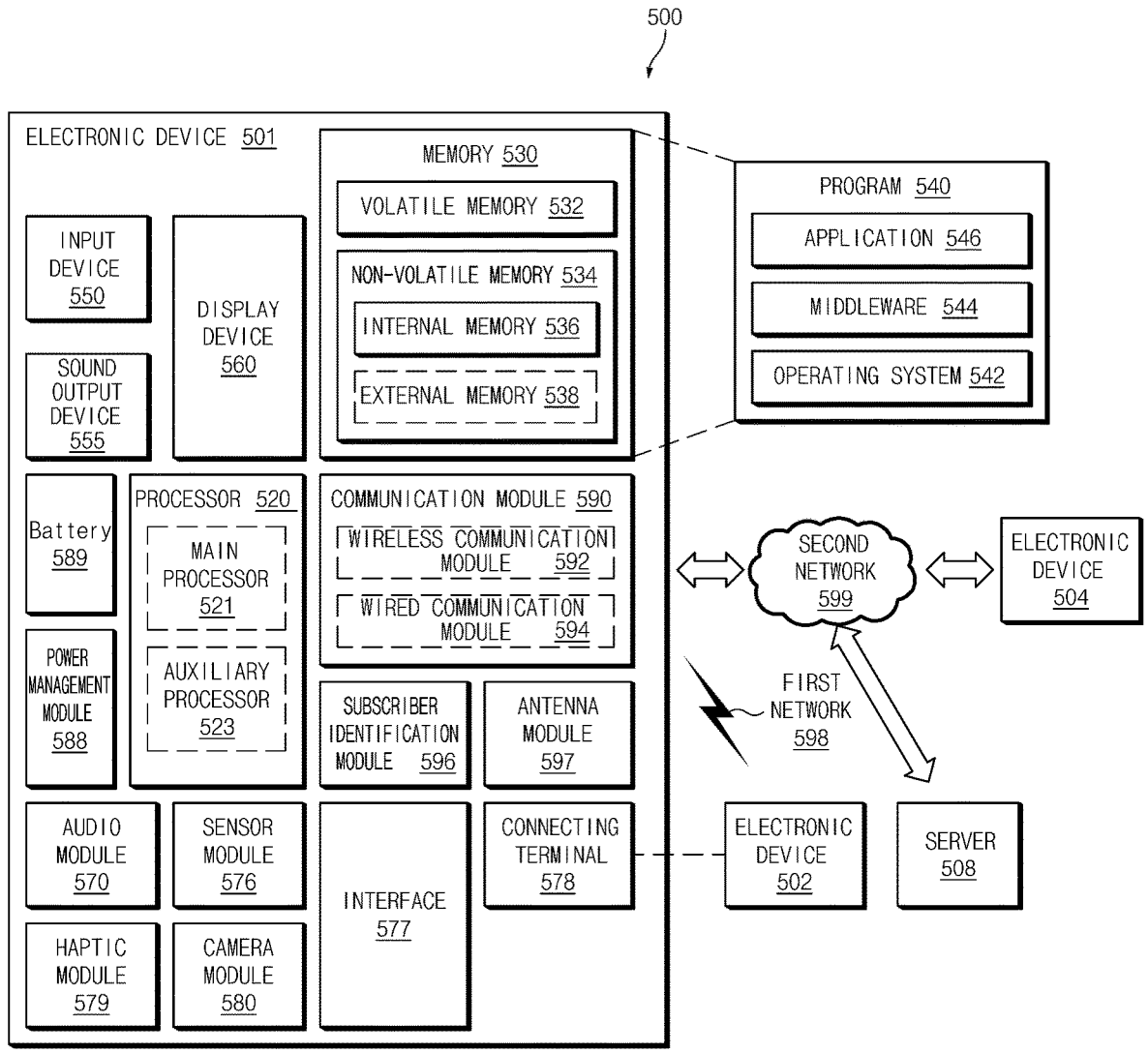
FIG. 5 is a block diagram illustrating an example electronic device in a network environment according to certain embodiments.

FIG. 5 is a block diagram illustrating an electronic device 501 in a network environment 500 according to certain embodiments. Referring to FIG. 5, the electronic device 501 in the network environment 500 may communicate with an electronic device 502 via a first network 598 (e.g., a short-range wireless communication network), or an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In some embodiments, at least one (e.g., the display device 560 or the camera module 580) of the components may be omitted from the electronic device 501, or one or more other components may be added in the electronic device 501. In some embodiments, some of the components may be implemented as single integrated circuitry. For example, the sensor module 576 (e.g., a fingerprint sensor, an iris sensor, or an illuminance sensor) may be implemented as embedded in the display device 560 (e.g., a display).

The processor 520 may execute, for example, software (e.g., a program 540) to control at least one other component (e.g., a hardware or software component) of the electronic device 501 coupled with the processor 520, and may perform various data processing or computation. According to an embodiment, as at least part of the data processing or computation, the processor 520 may load a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, a keyboard, or a digital pen (e.g., a stylus pen).

The sound output device 555 may output sound signals to the outside of the electronic device 501. The sound output device 555 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to an embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to an embodiment, the audio module 570 may obtain the sound via the input device 550, or output the sound via the sound output device 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to an embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to an embodiment, the antenna module 597 may include an antenna including a radiating element implemented using a conductive material or a conductive pattern formed in or on a substrate (e.g., PCB). According to an embodiment, the antenna module 597 may include a plurality of antennas. In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor(e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

According to the embodiments, the disclosure may provide a shielding film that is lighter in weight for a wide shielding area than a shield can.

Furthermore, according to the embodiments, the disclosure may provide a shielding film that is implemented to be brought into close contact with a printed circuit board and an electronic part, thereby shielding a wide area irrespective of the height and shape of the electronic part.

In addition, the disclosure may provide various effects that are directly or indirectly recognized.

While the disclosure has been shown and described with reference to certain embodiments thereof, it will be understood by those skilled in the art that various changes in form and details may be made therein without departing from the disclosure as defined by the appended claims and their equivalents.

What is claimed is:

1. An electronic device comprising:
   a printed circuit board;
   at least one electronic component mounted on the printed circuit board;
   a shielding film including a plurality of layers, the shielding film attached to at least a part of the printed circuit board and contacting an upper side surface of the electronic component; and
   a heat dissipation plate disposed on the shielding film,
   wherein the shielding film comprises:
      a metal shaping layer that is deformed to at least part of a shape of the electronic component,
      a conductive layer on to which the metal shaping layer is directly plated and contacting the metal shaping layer, the conductive layer blocking electromagnetic waves generated from the printed circuit board and/or the electronic component,
      an insulation layer disposed below the conductive layer and contacting the conductive layer, and disposed above the printed circuit board, the insulation layer electrically insulating the printed circuit board and/or the electronic component,
   wherein the conductive layer is disposed between the metal shaping layer and the insulation layers, and
   wherein the conductive layer includes a nano-conductive fiber, and at least part of the conductive layer is electrically connected with a ground part of the printed circuit board through the nano-conductive fiber plated with the metal shaping layer, and
   wherein a portion of the shielding film overlaps the heat dissipation plate, and a remaining portion of the shielding film does not overlap the heat dissipation plate.

2. The electronic device of claim 1, wherein the shielding film is attached to the printed circuit board through a hot pressing process,
   wherein the electronic component is a heat-producing component, and
   wherein a thermal dissipation material is deposited on an area of the metal shaping layer corresponding to the heat-producing component, and the heat dissipation plate is disposed on the thermal dissipation material, facilitating dissipation of heat for the heat-producing component through the shielding film, the thermal dissipation material, and the heat dissipation plate.

3. The electronic device of claim 2, wherein the conductive layer includes an adhesive layer, the adhesive layer formed using a hot-melting powder that is attached to the ground part during the hot pressing process.

4. The electronic device of claim 3, wherein the hot-melting powder is melted at a first temperature, and
wherein the first temperature is less than a second temperature which when applied to the printed circuit board and the electronic component, affects a durability of at least one of the printed circuit board and the electronic component.

5. The electronic device of claim 1, wherein the metal shaping layer is electrically connected with the ground part of the printed circuit board through the conductive layer and blocking the electromagnetic waves generated from the printed circuit board and/or the electronic component.

6. The electronic device of claim 1, wherein the metal shaping layer includes an aluminum thin film.

7. The electronic device of claim 1, wherein the insulation layer is formed using a material that stretches in reaction to heat.

8. The electronic device of claim 1, wherein the heat dissipation plate is disposed on the shielding film at a position corresponding to a location of the electronic component, such that heat generated by the electronic component is dissipated through the heat dissipation plate.

9. The electronic device of claim 1, wherein the metal shaping layer formed of a material that deforms according to the shape of the electronic component on which the shielding film is disposed responsive to an application of heat or a pressure, and to maintain the deformed shape after termination of the application of heat or the pressure.

10. A shielding film attached to a printed circuit board having at least one electronic component mounted thereon and disposed between the printed circuit board and a heat dissipation member, the shielding film comprising:

a metal shaping layer that is deformed to at least part of a shape of the electronic component;
a conductive layer on to which the metal shaping layer is directly plated and contacting the metal shaping layer, the conductive layer blocking electromagnetic waves generated from the printed circuit board and/or the electronic component, and
an insulation layer disposed below the conductive layer and contacting the conductive layer, and disposed above the printed circuit board, the insulation layer electrically insulating the printed circuit board and/or the electronic component,
wherein the conductive layer is disposed between the metal shaping layer and the insulation layer,
wherein the conductive layer includes a nano-conductive fiber, at least part of the conductive layer is electrically connected with a ground part of the printed circuit board through the nano-conductive fiber plated with the metal shaping layer, and
wherein a portion of the shielding film overlaps the heat dissipation member, and a remaining portion of the shielding film does not overlap the heat dissipation member.

11. The shielding film of claim 10, wherein the metal shaping layer is deformed to at least the part of the shape of the electronic component by application of heat or a pressure, and maintains the deformed shape after termination of the application of the heat or the pressure.

12. The shielding film of claim 11, wherein the metal shaping layer includes an aluminum thin film.

13. The shielding film of claim 10, wherein the conductive layer includes the nano-conductive fiber and a hot-melting powder, and
wherein the conductive layer is coupled to the ground part by a hot pressing process.

* * * * *